US012610641B2

(12) United States Patent
Lin et al.

(10) Patent No.: US 12,610,641 B2
(45) Date of Patent: Apr. 21, 2026

(54) IMAGE SENSOR AND MANUFACTURING METHOD THEREOF

(71) Applicant: VisEra Technologies Company Ltd., Hsin-Chu City (TW)

(72) Inventors: Cheng-Hsuan Lin, Hsin-Chu City (TW); Kuang-Yu Huang, Hsin-Chu City (TW); Zong-Ru Tu, Hsin-Chu City (TW); Huang-Jen Chen, Hsin-Chu City (TW); Han-Lin Wu, Hsin-Chu City (TW)

(73) Assignee: VISERA TECHNOLOGIES COMPANY LTD., Hsin-Chu City (TW)

( * ) Notice: Subject to any disclaimer, the term of this patent is extended or adjusted under 35 U.S.C. 154(b) by 379 days.

(21) Appl. No.: 18/322,470

(22) Filed: May 23, 2023

(65) Prior Publication Data

US 2024/0395837 A1 Nov. 28, 2024

(51) Int. Cl.
*H10F 39/00* (2025.01)

(52) U.S. Cl.
CPC ....... *H10F 39/8053* (2025.01); *H10F 39/024* (2025.01); *H10F 39/8057* (2025.01); *H10F 39/8063* (2025.01)

(58) Field of Classification Search
CPC ............... H10F 39/8053; H10F 39/024; H10F 39/8057; H10F 39/8063
See application file for complete search history.

(56) References Cited

U.S. PATENT DOCUMENTS

2016/0351610 A1* 12/2016 Chen .................. H10F 39/8057
2019/0088704 A1 3/2019 Jang et al.
2019/0267420 A1* 8/2019 Lee .................... H10F 39/8063

FOREIGN PATENT DOCUMENTS

| EP | 3462495 A | 4/2019 |
|---|---|---|
| TW | 201642457 A | 12/2016 |
| TW | 201813070 A | 4/2018 |
| TW | 201937207 A | 9/2019 |

* cited by examiner

*Primary Examiner* — Jonathan Han
(74) *Attorney, Agent, or Firm* — LIU & LIU

(57) ABSTRACT

An image sensor includes a first color filter disposed on a first photodiode, a first grid, and a first micro lens disposed on the first color filter and the first grid. The first grid includes a first main portion and a first shielding portion extended from the first main portion. The first main portion surrounds the first color filter and the first shielding portion partially covers the first color filter such that a first cavity defined by the first shielding portion is configured over the first color filter. The first color filter or the first micro lens includes a first protruding portion filled in the first cavity, and a width of the first protruding portion is in a range from 0.1 pixel size to 0.8 pixel size. A manufacturing method of an image sensor is also disclosed.

19 Claims, 19 Drawing Sheets

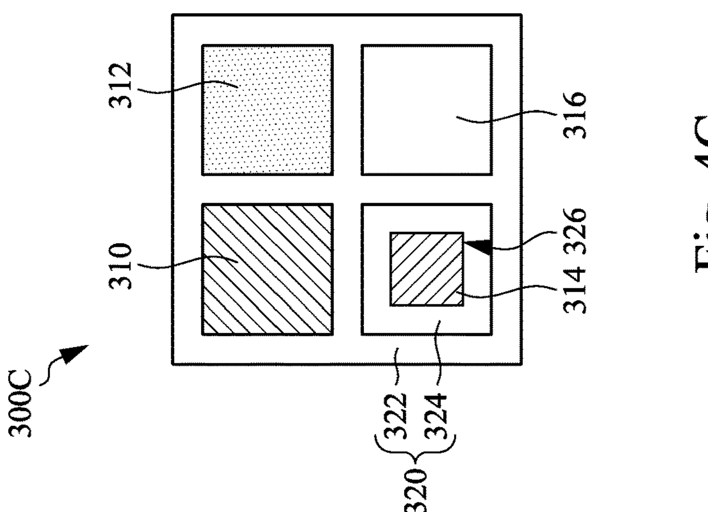
Fig. 4C
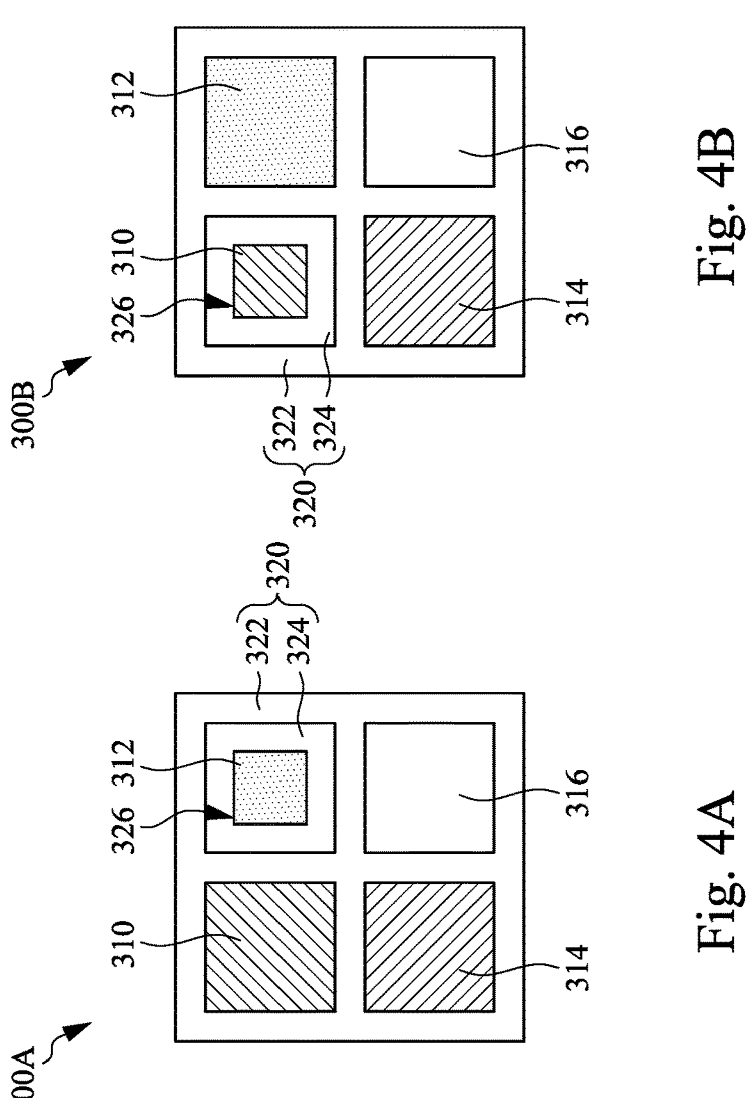
Fig. 4B
Fig. 4A

S32

S31

IMAGE SENSOR AND MANUFACTURING METHOD THEREOF

BACKGROUND

Field of Invention

The present disclosure relates to an image sensor and manufacturing method thereof.

Description of Related Art

Image devices have been widely used in various image-capturing apparatuses, for example video cameras, digital cameras and the like. Generally, solid-state imaging devices, for example charge-coupled device (CCD) sensors or complementary metal-oxide semiconductor (CMOS) sensors, have photoelectric transducers such as photodiodes for converting light into electric charges. The photodiodes are formed on a semiconductor substrate such as a silicon chip. Signal charges corresponding to photoelectrons generated in the photodiodes are obtained by a CCD-type or a CMOS-type reading circuit.

SUMMARY

An aspect of the disclosure provides an image sensor. The image sensor includes a first color filter disposed on a first photodiode, a first grid, and a first micro lens disposed on the first color filter and the first grid. The first grid includes a first main portion and a first shielding portion extended from the first main portion. The first main portion surrounds the first color filter and the first shielding portion partially covers the first color filter such that a first cavity defined by the first shielding portion is configured over the first color filter. The first color filter or the first micro lens includes a first protruding portion filled in the first cavity, and a width of the first protruding portion is in a range from 0.1 pixel size to 0.8 pixel size.

In some embodiments, a top surface of the first protruding portion of the first color filter is coplanar with a top surface of the first shielding portion of the first grid.

In some embodiments, a bottom surface of the first protruding portion of the first micro lens is coplanar with a bottom surface of the first shielding portion of the first grid.

In some embodiments, the image sensor further includes a second color filter disposed on a second photodiode, a second grid, and a second micro lens disposed on the second color filter and the second grid. The second grid includes a second main portion and a second shielding portion extended from the second main portion. The second main portion surrounds the second color filter and the second shielding portion partially covers the second color filter such that a second cavity defined by the second shielding portion is configured over the second color filter. The second color filter or the second micro lens includes a second protruding portion filled in the second cavity, a width of the second protruding portion is different from the width of the first protruding portion, and the width of the second protruding portion is in a range from 0.1 pixel size to 0.8 pixel size.

In some embodiments, a thickness of the second protruding portion is different from a thickness of the first protruding portion.

In some embodiments, a thickness of the first protruding portion is less than a height of the first main portion of the first grid, and a thickness of the second protruding portion is less than a height of the second main portion of the second grid.

In some embodiments, a shape of the second protruding portion is different from a shape of the first protruding portion, and the shape of the first protruding portion and the shape of the second protruding portion include square, circle, polygon and rhombus.

In some embodiments, the first photodiode has a first center line, the second photodiode has a second center line, the first protruding portion has a third center line, the second protruding portion has a fourth center line, and a first distance between the first center line and the third center line is different from a second distance between the second center line and the fourth center line.

In some embodiments, a ratio of the first distance to the pixel size is in a range from about 0.1 to about 0.5.

In some embodiments, a ratio of the first distance to the second distance is in a range from about 0.1 to about 0.9.

In some embodiments, the first micro lens has a fifth center line, and the first distance is less than a third distance between the first center line and the fifth center line.

In some embodiments, the second micro lens has a sixth center line, and the third distance is different from a fourth distance between the second center line and the sixth center line.

In some embodiments, a ratio of the third distance to the fourth distance is in a range from about 0.1 to about 0.9.

Another aspect of the disclosure provides a manufacturing method of an image sensor. The method includes forming a color filter over a photodiode; forming a grid material layer over the color filter; etching the grid material layer to form a grid, wherein the grid includes a main portion and a shielding portion extended from the main portion, the main portion surrounds the color filter and the shielding portion covers an edge of the color filter; and forming a micro lens over the color filter and the grid.

In some embodiments, the method further includes etching the color filter such that the color filter includes a protruding portion surrounded by the shielding portion, and a width of the protruding portion of the color filter is in a range from 0.1 pixel size to 0.8 pixel size.

In some embodiments, etching the grid material layer to form the grid includes forming a cavity defined by the shielding portion, and forming the micro lens over the color filter and the grid is performed such that the micro lens includes a protruding portion filled in the cavity, and a width of the protruding portion of the micro lens is in a range from 0.1 pixel size to 0.8 pixel size.

In some embodiments, forming the grid material layer over the color filter includes forming a barrier structure on a substrate having the photodiode; forming a transparent material over the color filter and the barrier structure; and etching the transparent material to form the shielding portion.

In some embodiments, forming the grid material layer over the color filter includes forming a barrier structure on a substrate having the photodiode; forming a spacing material over the color filter and the barrier structure; etching the spacing material to form a spacing layer, wherein a height of the spacing layer is less than a height of the color filter; forming a transparent material over the color filter and the spacing layer; and etching the transparent material to form the shielding portion.

In some embodiments, the color filter is made of an inorganic material, and forming the color filter over the photodiode includes depositing a color filter material over the photodiode; planarizing the color filter material; and etching the color filter material.

In some embodiments, the color filter is made of an organic material, and forming the color filter over the photodiode includes depositing a color filter material over the photodiode; exposing the color filter material; and developing the color filter material.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 4A to FIG. 4E are schematic top views of a unit of the image sensor according to different embodiments of the disclosure;

DESCRIPTION OF THE EMBODIMENTS

Figure 1:
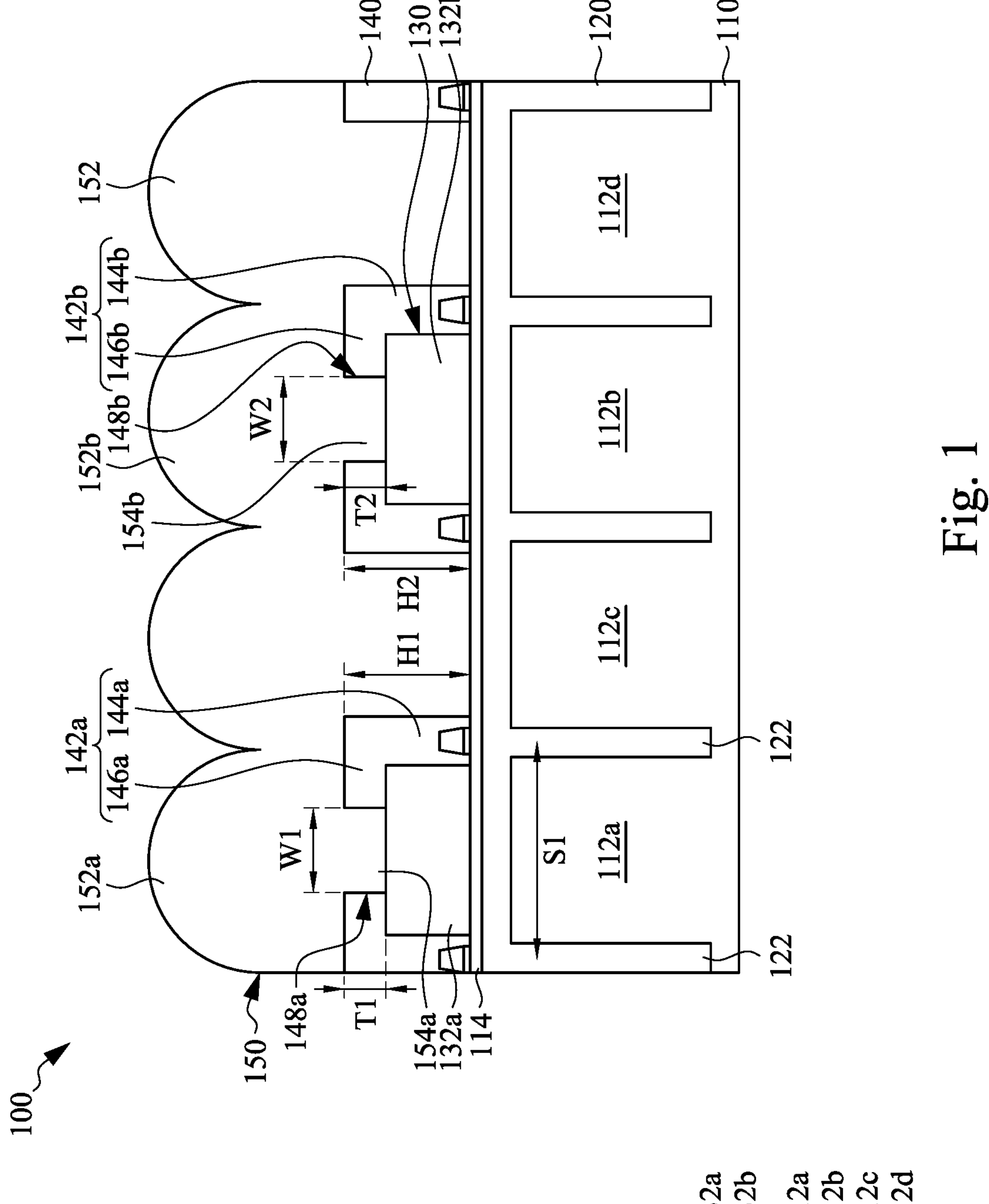
FIG. 1 is a cross-sectional view of an image sensor according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a cross-sectional view of an image sensor according to some embodiments of the disclosure. The image sensor 100 includes a substrate 110, a plurality of photodiodes 112 formed in the substrate 110, a deep trench isolation structure 120 disposed in the substrate 110 to separate the photodiodes 112 from each other. A pixel size S1 is defined by the deep trench isolation structure 120. More particularly, the pixel size S1 is the distance between centers of the pair of the deep trench isolation portions 122 at opposite sides of the corresponding photodiode 112. Namely, the pixel size S1 can be regarded as a dimension of the photodiode 112 adding a dimension of the deep trench isolation portion 122. Optionally, a thin dielectric layer 114 can be formed on the substrate 110.

The image sensor 100 further includes a color filter layer 130 on the substrate 110, in which the color filter layer 130 includes a plurality of color filters 132 selectively disposed on the photodiodes 112. For example, there are four photodiodes 112 and two color filters 132 illustrated in FIG. 1, in which the first color filter 132*a* is disposed on the first photodiode 112*a*, the second color filter 132*b* is disposed on the second photodiode 112*b*, and the third photodiode 112*c* and the fourth photodiode 112*d* are free coverage by the color filters 132. The filtering wavebands of the first color filter 132*a* and the second color filter 132*b* can be the same or different.

The image sensor 100 further includes a grid layer 140 disposed on the substrate 110 to separate the color filters. For example, the grid layer 140 includes a first grid 142*a* corresponding to the first color filter 132*a* and a second grid 142*b* corresponding to the second color filter 132*b*. The grid layer 140 can be made of an organic material or an inorganic material.

The first grid 142*a* includes a first main portion 144*a* and a first shielding portion 146*a* extended from the first main portion 144*a*. The first main portion 144*a* surrounds the first color filter 132*a*, and the first shielding portion 146*a* partially covers the first color filter 132*a* such that a first cavity 148*a* is defined by the first shielding portion 146*a*. The first cavity 148*a* is configured over the first color filter 132*a*. The peripheral portion of the first color filter 132*a* is covered by the first shielding portion 146*a*, and the first cavity 148*a* exposes a center portion of the first color filter 132*a*.

The second grid 142*b* includes a second main portion 144*b* and a second shielding portion 146*b* extended from the second main portion 144*b*. The second main portion 144*b* surrounds the second color filter 132*b*, and the second shielding portion 146*b* partially covers the second color filter 132*b* such that a second cavity 148*b* is defined by the second shielding portion 146*b*. The second cavity 148*b* is configured over the second color filter 132*b*. The peripheral portion of the second color filter 132*b* is covered by the second shielding portion 146*b*, and the second cavity 148*b* exposes a center portion of the second color filter 132*b*.

The image sensor 100 further includes a micro lens layer 150 disposed on the color filter layer 130 and the substrate 110. The micro lens layer 150 includes a plurality of micro lens 152 disposed on the photodiodes 112, respectively. The micro lens layer 150 has portions on the third and fourth photodiodes 112*c* and 112*d* and between the first grid 142*a* and the second grid 142*b*.

In some embodiments, the first cavity 148*a* and the second cavity 148*b* are filled by the micro lens layer 150. For example, the first micro lens 152*a* is disposed on the first photodiode 112*a* and has a first protruding portion 154*a* filled in the first cavity 148*a*, and the second micro lens 152*b* is disposed on the second photodiode 112*b* and has a second protruding portion 154*b* filled in the second cavity 148*b*.

The bottom surfaces of the first protruding portion 154*a* of the first micro lens 152*a* and the second protruding portion 154*b* of the second micro lens 152*b* are coplanar with bottom surfaces of the first shielding portion 146*a* of the first grid 142*a* and the second shielding portion 146*b* of the second grid 142*b*.

A thickness T1 of the first protruding portion 154*a* of the first micro lens 152*a* is less than a height H1 of the first main portion 144*a* of the first grid 142*a*, and a thickness T2 of the second protruding portion 154*b* of the second micro lens 152*b* is less than a height H2 of the second main portion 144*b* of the second grid 142*b*. The thicknesses T1, T2 of the first protruding portion 154*a* and the second protruding portion 154*b* can be the same or different.

In some embodiments, the width W1 of the first protruding portion 154*a* of the first micro lens 152*a* can be the same as or different from the width W2 of the second protruding portion 154*b* of the second micro lens 152*b*. The shapes of the first protruding portion 154*a* of the first micro lens 152*a* and the second protruding portion 154*b* of the second micro lens 152*b* can be the same or different.

The width W1 of the first protruding portion 154*a* of the first micro lens 152*a* is in a range from 0.1 pixel size S1 to 0.8 pixel size S1. The width W2 of the second protruding portion 154*b* of the second micro lens 152*b* is in a range from 0.1 pixel size S1 to 0.8 pixel size S1. If the first protruding portion 154*a* or the second protruding portion 154*b* is too small, the function of edge shifting is failed and is unable to generate the cavity to tune the optical characteristics.

Figure 2:
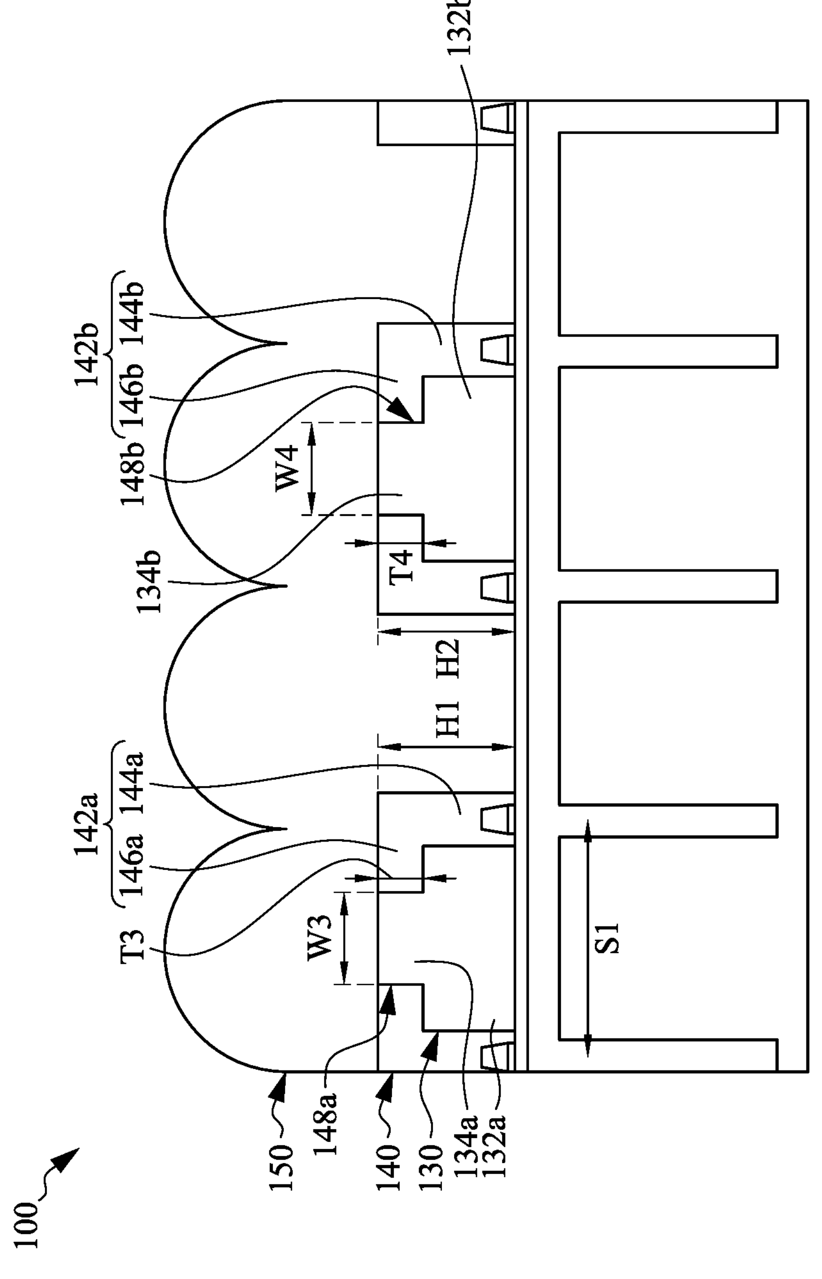
FIG. 2 is a cross-sectional view of an image sensor according to some embodiments of the disclosure.
Figure 2:
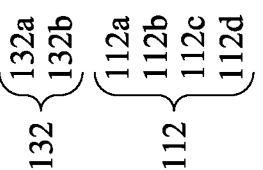

Reference is made to FIG. 2, which is a cross-sectional view of an image sensor according to some embodiments of the disclosure. In some embodiments, the first cavity 148*a* and the second cavity 148*b* are filled by the color filter layer 130. For example, the first color filter 132*a* has a first protruding portion 134*a* filled in the first cavity 148*a*, and the second color filter 132*b* has a second protruding portion 134*b* filled in the second cavity 148*b*.

The top surfaces of the first protruding portion 134*a* of the first color filter 132*a* and the second protruding portion 134*b* of the second color filter 132*b* are coplanar with top surfaces of the first shielding portion 146*a* of the first grid 142*a* and the second shielding portion 146*b* of the second grid 142*b*.

A thickness T3 of the first protruding portion 134*a* of the first color filter 132*a* is less than the height H1 of the first main portion 144*a* of the first grid 142*a*, and a thickness T4 of the second protruding portion 134*b* of the second color filter 132*b* is less than the height H2 of the second main portion 144*b* of the second grid 142*b*. The thicknesses T3, T4 of the first protruding portion 134*a* and the second protruding portion 134*b* can be the same or different.

In some embodiments, the width W3 of the first protruding portion 134*a* of the first color filter 132*a* can be the same as or different from the width W4 of the second protruding portion 134*b* of the second color filter 132*b*. The shapes of the first protruding portion 134*a* of the first color filter 132*a* and the second protruding portion 134*b* of the second color filter 132*b* can be the same or different.

The width W3 of the first protruding portion 134*a* of the first color filter 132*a* is in a range from 0.1 pixel size S1 to 0.8 pixel size S1. The width W4 of the second protruding portion 134*b* of the second color filter 132*b* is in a range from 0.1 pixel size S1 to 0.8 pixel size S1. If the first protruding portion 134*a* or the second protruding portion 134*b* is too small, the function of edge shifting is failed and is unable to generate the cavity to tune the optical characteristics.

Reference is made to both FIG. 1 and FIG. 2. By introducing the cavities such as the first cavity 148*a* and the second cavity 148*b* in the grid layer 140 to partially cover the color filters such as the first color filter 132*a* and the second color filter 132*b* by the shielding portion such as the first shielding portion 146*a* and the second shielding portion 146*b*, the energy distribution to the photodiodes 112 can be more even, and the red pixel and clear (white) pixel sensitivity gap (RC gap) of the image sensor can be reduced accordingly.

Figures 3A, 3B, 3C:
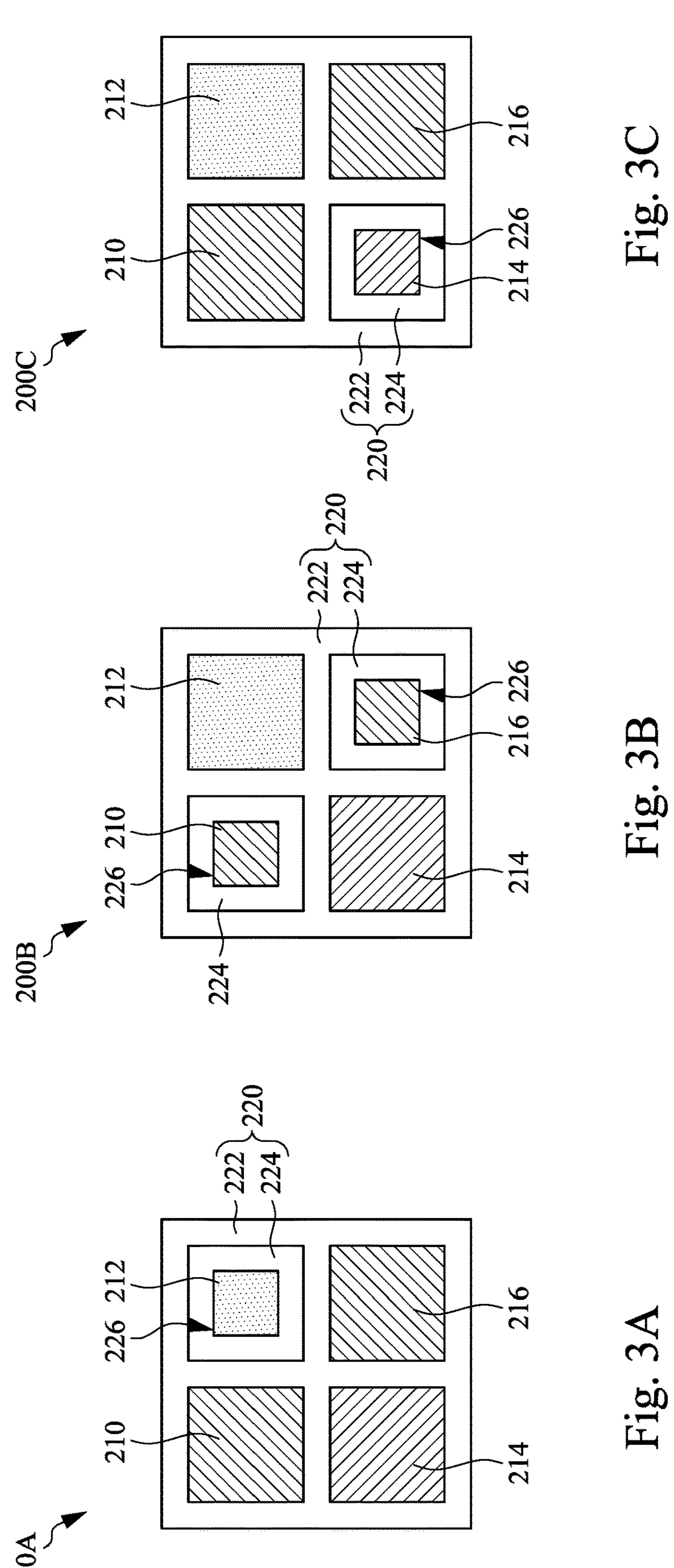
FIG. 3A to FIG. 3C are schematic top views of a unit of the image sensor according to different embodiments of the disclosure.

Reference is made to FIG. 3A to FIG. 3C, in which FIG. 3A to FIG. 3C are schematic top views of a unit of the image sensor according to different embodiments of the disclosure. The units 200A, 200B, and 200C each includes four color filters 210, 212, 214, and 216 and a grid layer 220 configured to separate the color filters 210, 212, 214, and 216. The color filters 210, 212, 214, and 216 may include three colors, in which the color filters 210 and 216 at diagonal corners have the same color, and the color filters 212 and 214 have different colors, respectively. For example, in some embodiments, the color filters 210 and 216 can be green color, the color filter 212 can be red color, and the color filter 214 can be blue color. In some other embodiments, the color filters 210 and 216 can be yellow color, the color filter 212 can be red color, and the color filter 214 can be blue color. Alternatively, in some other embodiments, the color filters 210 and 216 can be yellow color, the color filter 212 can be magenta color, and the color filter 214 can be cyan color.

The grid layer 220 has a main portion 222 surrounding the color filters 210, 212, 214, and 216 and one or more shielding portions 224 extending from the main portion 222 for covering an edge of the one or more of the color filters 210, 212, 214, and 216. Thus one or more cavities 226 are defined on the corresponding color filters 210, 212, 214, and 216, and the one or more cavities 226 are further filled by the protruding portion (not shown), in which the protruding portion can be formed by the micro lens layer (as discussed in FIG. 1) or formed by the color filter (as discussed in FIG. 2).

As shown in the unit 200A of FIG. 3A, the shielding portion 224 is disposed on the color filter 212, such as corresponding to the red color, and covers an edge of the color filter 212. The cavity 226 is defined on the color filter 212. As shown in the unit 200C of FIG. 3B, the shielding portions 224 are disposed on the color filters 210 and 216, such as corresponding to the green color, and cover edges of the color filters 210 and 216. The cavities 226 are defined on the color filters 210 and 216. As shown in the unit 200C of FIG. 3C, the shielding portion 224 is disposed on the color filter 214, such as corresponding to the blue color, and covers an edge of the color filter 214. The cavity 226 is defined on the color filter 214.

Reference is made to FIG. 4A to FIG. 4E, in which FIG. 4A to FIG. 4E are schematic top views of a unit of the image sensor according to different embodiments of the disclosure. The units 300A, 300B, 300C, 300D, and 300E each includes four color filters 310, 312, 314, and 316 and a grid layer 320 configured to separate the color filters 310, 312, 314, and 316. The color filters 310, 312, 314, and 316 may include four different colors, respectively. For example, in some embodiments, the color filter 310 can be green color, the color filter 312 can be red color, the color filter 314 can be blue color, and the color filter 316 can be white color. In some other embodiments, the color filter 310 can be yellow color, the color filter 312 can be red color, the color filter 314 can be blue color, and the color filter 316 can be white color. Alternatively, in some other embodiments, the color filter 310 can be yellow color, the color filter 312 can be magenta color, the color filter 314 can be cyan color, and the color filter 316 can be white color.

The grid layer 320 has a main portion 322 surrounding the color filters 310, 312, 314, and 316 and a shielding portion 324 extending from the main portion 322 for covering an edge of the one of the color filters 310, 312, 314, and 316. Thus a cavity 326 is defined on the corresponding color filters 310, 312, 314, and 316, and the cavity 326 is further filled by the protruding portion formed by the micro lens layer or the color filter.

Figures 4D, 4E:
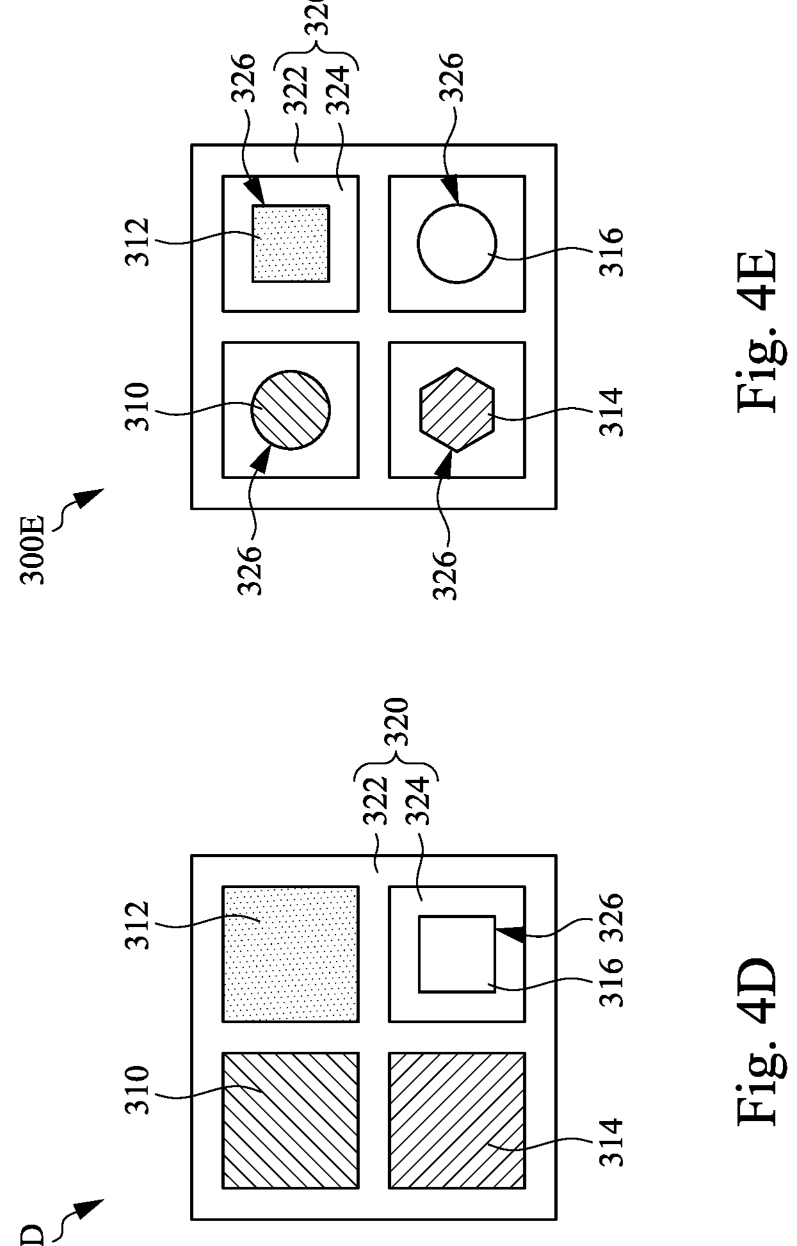

As shown in the unit 300A of FIG. 4A, the shielding portion 324 is disposed on the color filter 312, such as corresponding to the red color, and covers an edge of the color filter 312. The cavity 326 is defined on the color filter 312. As shown in the unit 300B of FIG. 4B, the shielding portion 324 is disposed on the color filter 310, such as corresponding to the green color, and covers an edge of the color filter 310. The cavity 326 is defined on the color filter 310. As shown in the unit 300C of FIG. 4C, the shielding portion 324 is disposed on the color filter 314, such as corresponding to the blue color, and covers an edge of the color filter 314. The cavity 326 is defined on the color filter 314. As shown in the unit 300D of FIG. 4D, the shielding portion 324 is disposed on the color filter 316, such as corresponding to the white color, and covers an edge of the color filter 316. The cavity 326 is defined on the color filter 316.

In some embodiments, as shown in FIG. 4E, the grid layer 320 includes plural shielding portions 324, and the shielding portions 324 cover edges of the color filters 310, 312, 314, and 316, respectively. Plural cavities 326 are defined on the color filters 310, 312, 314, and 316. The sizes and the shapes of the cavities 326 can be the same or different.

Figure 5B:
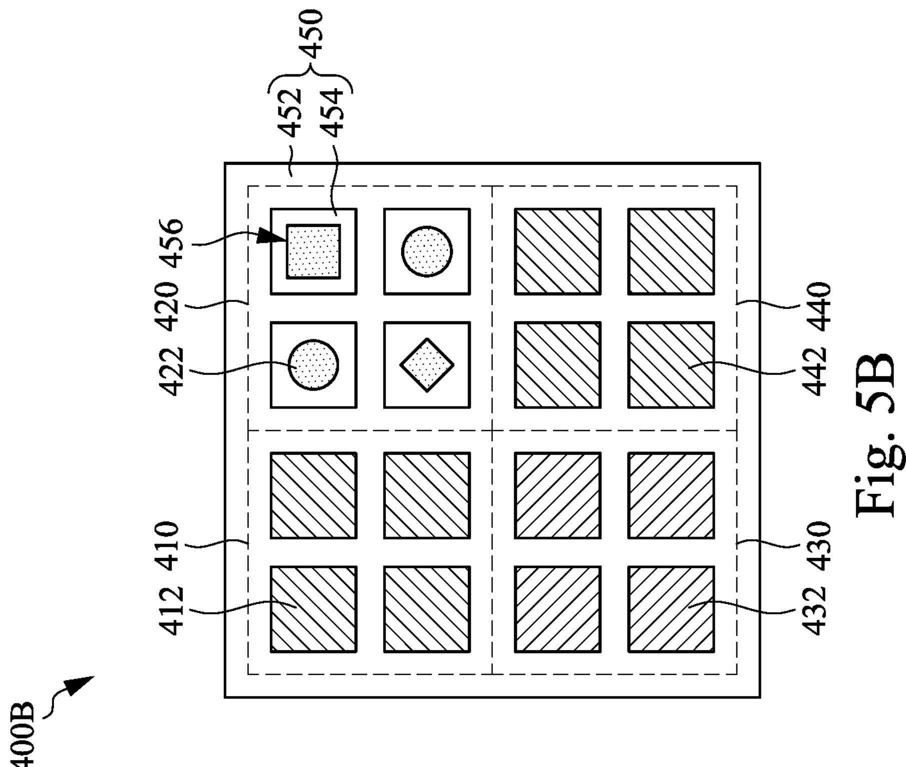
FIG. 5A and FIG. 5B are schematic top views of a unit array of the image sensor according to different embodiments of the disclosure.
Figure 5A:
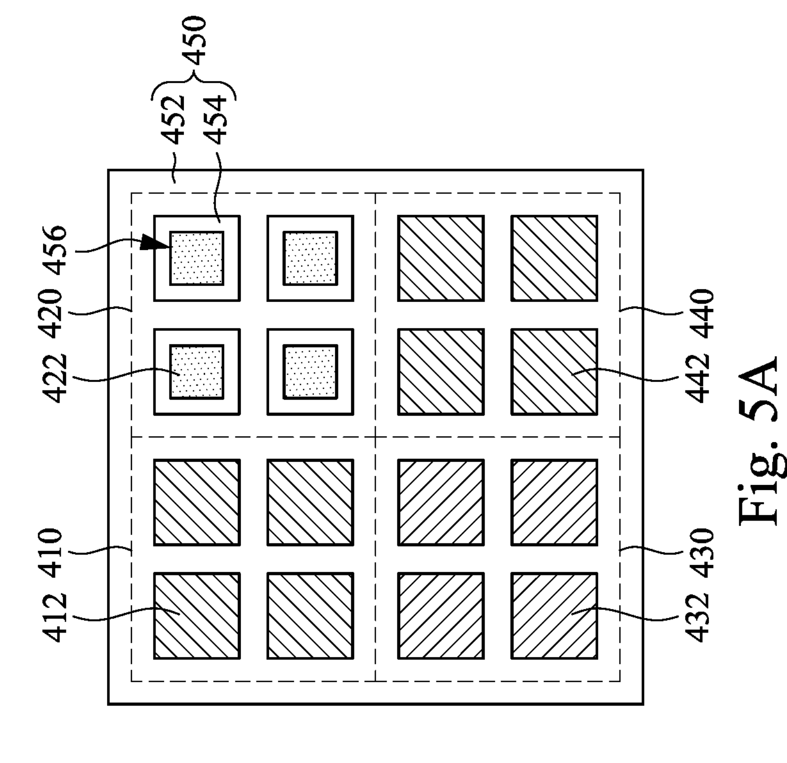

Reference is made to FIG. 5A and FIG. 5B, in which FIG. 5A and FIG. 5B are schematic top views of a unit array of the image sensor according to different embodiments of the disclosure. In some embodiments, the unit array 400A or 400B of the image sensor includes a plurality of units arranged in an n'n array, in which n is an integral. For example, as shown in the unit array 400A or unit array 400B, each of the unit array 400A and unit array 400B includes a first unit 410, a second unit 420, a third unit 430, and a fourth unit 440. Each of the first, second, third, and fourth units 410, 420, 430, and 440 includes an m*m color filter array, in which m is an integral. For example, each of the first, second, third, and fourth units 410, 420, 430, and 440 has four color filters 412, 422, 432, and 442, respectively. The color filters 412 of the first unit 410 and the color filters 442 of the fourth units 440 have the first color, the color filters 422 of the second unit 420 have the second color that is different from the first color, and the color filters 432 of the third unit 430 have the third color that is different from the first color and the second color. In some other embodiments, the color filters 412 of the first unit 410 and the color filters 442 of the fourth units 440 may have different colors.

The grid layer 450 has a main portion 452 surrounding the color filters 412, 422, 432, and 442 and a shielding portion 454 extending from the main portion 452 for covering edges of the color filters of at least one of first, second, third, and fourth units 410, 420, 430, and 440 such as the color filters 422 of the second unit 420. Thus a plurality of cavities 456 are defined on the corresponding color filters such as the color filters 422, and the cavities 456 are further filled by the protruding portions formed by the micro lens layer or the color filter.

In some embodiments, as illustrate in the unit array 400A, the cavities 456 may have the same size and same shape. In some other embodiments, as illustrate in the unit array 400B, the cavities 456 may have different sizes and different shapes.

Figure 6A:
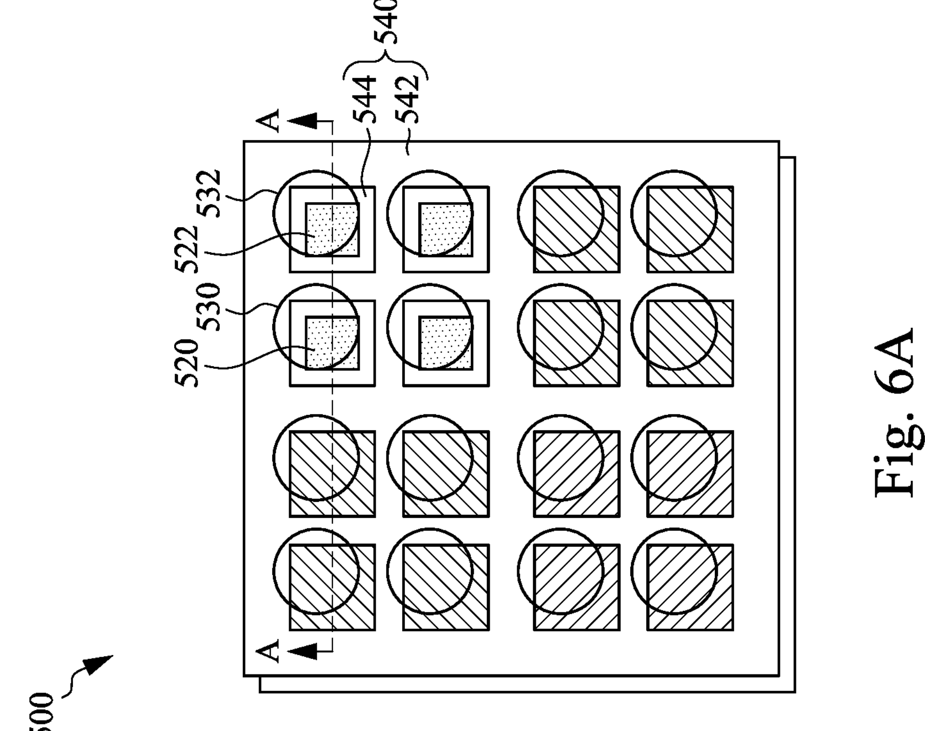
FIG. 6A is a schematic top view of an image sensor according to some embodiments of the disclosure.
Figure 6B:
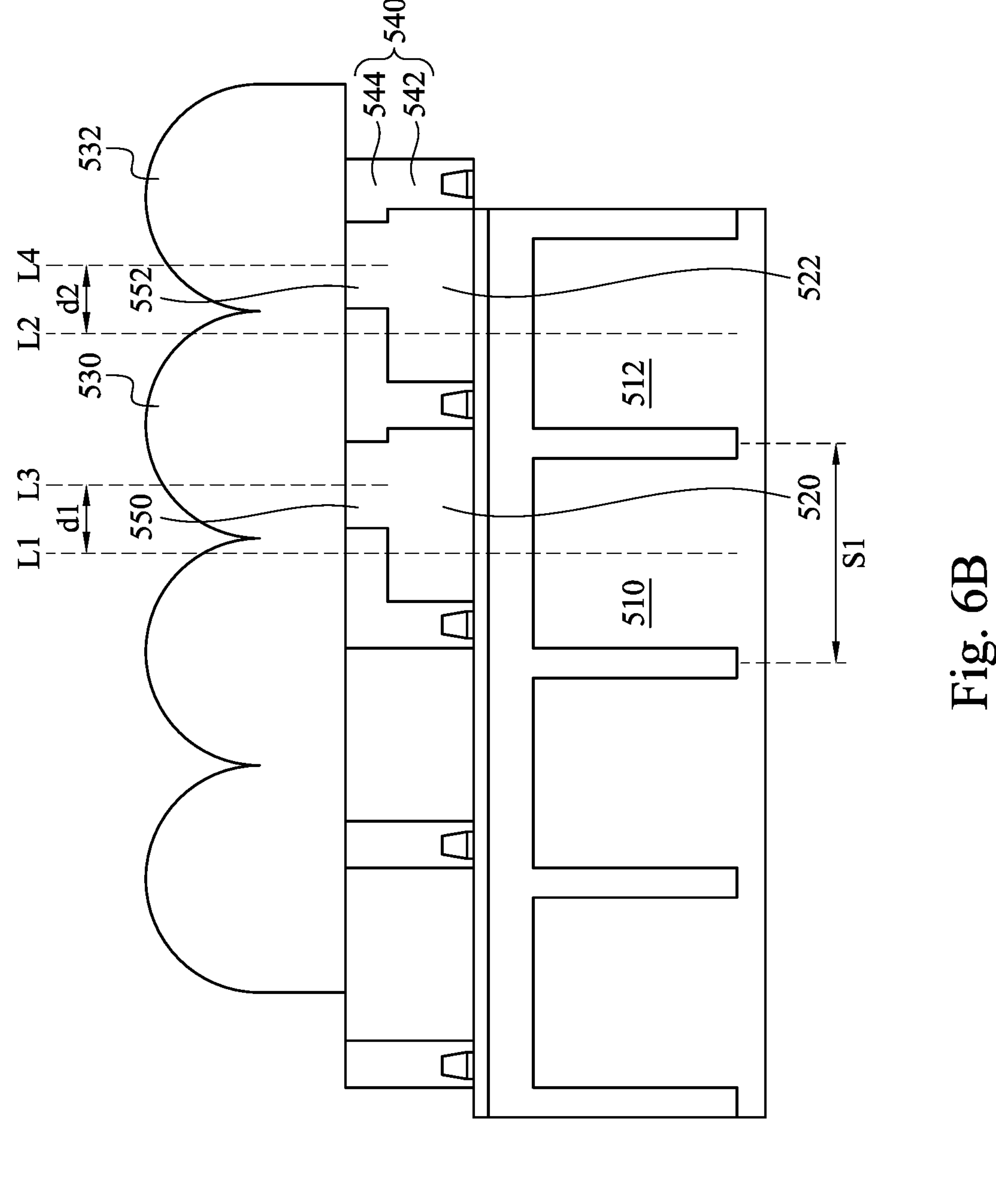
FIG. 6B and FIG. 6C are schematic cross-sectional views of the image sensor taken along line A-A of FIG. 6A.
Figure 6C:
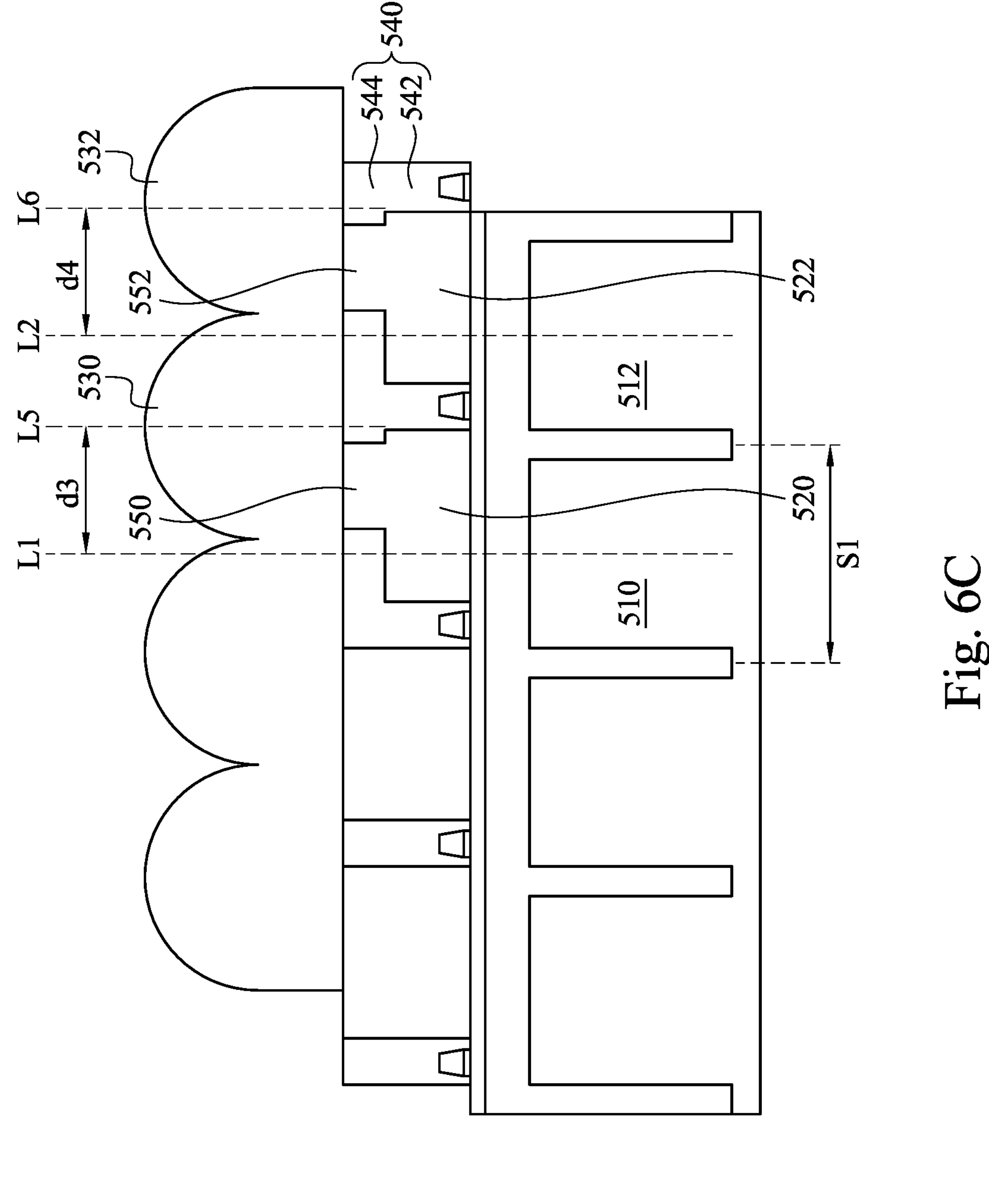

Reference is made to FIG. 6A to FIG. 6C, in which FIG. 6A is a schematic top view of an image sensor according to some embodiments of the disclosure, FIG. 6B and FIG. 6C are schematic cross-sectional views of the image sensor taken along line A-A of FIG. 6A. The image sensor 500 includes a first photodiode 510, a second photodiode 512, a first color filter 520 on the first photodiode 510, a second color filter 522 on the second photodiode 512, a first micro lens 530 on the first color filter 520, and a second micro lens 532 on the second color filter 522. The image sensor 500 further includes a grid layer 540. The grid layer 540 has a main portion 542 surrounding the first color filter 520 and the second color filter 522 and a shielding portion 544 partially covering a top surface of the first color filter 520 and the second color filter 522.

The image sensor 500 further includes a first protrusion 550 on the first color filter 520 and a second protrusion 552 on the second color filter 522. The first protrusion 550 and the second protrusion 552 are filled in cavities defined by the shielding portion 544. In some embodiments, the first protrusion 550 and the second protrusion 552 are made of the first color filter 520 and the second color filter 522. In some other embodiments, the first protrusion 550 and the second protrusion 552 are made of the first micro lens 530 and the second micro lens 532.

As shown in FIG. 6B, the first color filter 520 and the second color filter 522 can be misaligned with the first photodiode 510 and the second photodiode 512. More particularly, the first photodiode 510 has a first center line L1, the second photodiode 512 has a second center line L2, the first protruding portion 550 has a third center line L3, and the second protruding portion 552 has a fourth center line L4. A first distance d1 is between the first center line L1 and the third center line L3, and a second distance d2 is between the second center line L2 and the fourth center line L4. The first distance d1 is equal to or greater than zero. The second distance d2 is equal to or greater than zero. In some embodiments, the first distance d1 can be the same as the second distance d2. In some other embodiments, the first distance d1 can be different from the second distance d2.

In some embodiments, the ratio of the first distance d1 to the pixel size S1 is in a range from about 0.1 to about 0.5, and the ratio of the second distance d2 to the pixel size S1 is in a range from about 0.1 to about 0.5. In some embodiments, the ratio of the first distance d1 to the second distance d2 is in a range from about 0.1 to about 0.9.

As shown in FIG. 6C, the first micro lens 530 and the second micro lens 532 can be misaligned with the first photodiode 510 and the second photodiode 512. More particularly, the first micro lens 530 has a fifth center line L5, and the second micro lens 532 has a sixth center line L6. A third distance d3 is between the first center line L1 and the fifth center line L5, and a fourth distance d4 is between the second center line L2 and the sixth center line L6. The third distance d3 is equal to or greater than zero. The fourth distance d4 is equal to or greater than zero. In some embodiments, the third distance d3 can be the same as the fourth distance d4 or the first distance d1 (as shown in FIG. 6B). In some other embodiments, the third distance d3 can be different from the fourth distance d4 or the first distance d1.

In some embodiments, the ratio of the third distance d3 to the pixel size S1 is in a range from about 0.1 to about 0.5, and the ratio of the fourth distance d4 to the pixel size S1 is in a range from about 0.1 to about 0.5. In some embodiments, the ratio of the third distance d3 to the fourth distance d4 is in a range from about 0.1 to about 0.9.

Figure 7:
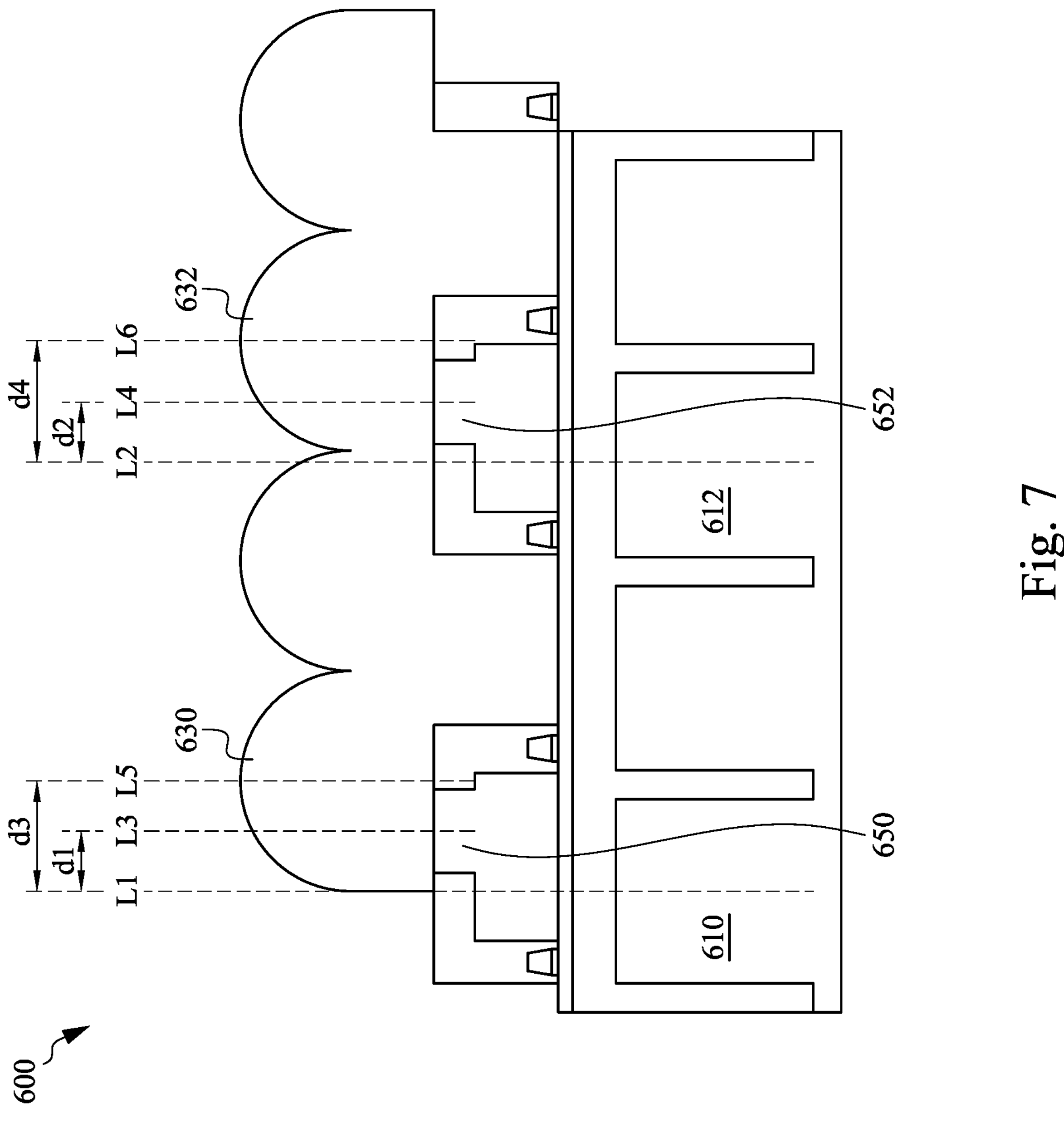
FIG. 7 is a schematic cross-sectional view of the image sensor according to some embodiments of the disclosure.

Reference is made to FIG. 7, which is a schematic cross-sectional view of the image sensor according to some embodiments of the disclosure. The image sensor 600 may include the units as disclosed in FIG. 3A to FIG. 4E. The first distance d1 between the first center line L1 of the first photodiode 610 and the third center line L3 of the first protrusion 650 can be the same or different from the second distance d2 between the second center line L2 of the second photodiode 612 and the fourth center line L4 of the second protrusion 652. The third distance d3 between the first center line L1 of the first photodiode 610 and the fifth center line L5 of the first micro lens 630 can be the same or different from the fourth distance d4 between the second center line L2 of the second photodiode 612 and the sixth center line L6 of the second micro lens 632.

The ratio of the third distance d3 to the fourth distance d4 is in a range from about 0.1 to about 0.9. The shifts of the first protrusion 650 and the second protrusion 652 such as the first distance d1 and the second distance d2 are less than shifts of the first micro lens 630 and the second micro lens 632 such as the third distance d3 and the fourth distance d4.

Figures 8A, 8B, 8C, 8D:
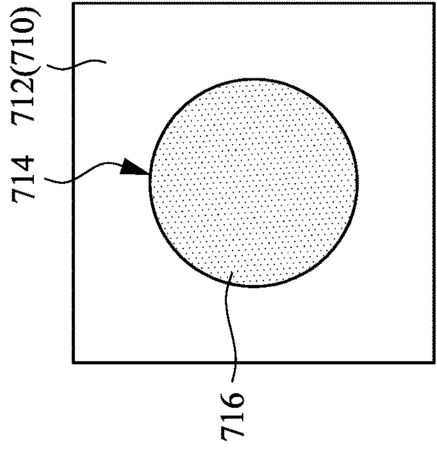
FIG. 8A to FIG. 8D are schematic top views of the image sensor according to different embodiments of the disclosure.

Reference is made to FIG. 8A to FIG. 8D, which are schematic top views of the image sensor according to different embodiments of the disclosure. As discussed in the previous embodiments, the shielding portion 712 of the grid 710 defines the cavity 714 over the photodiode, and the cavity 714 is further filled by the protruding portion 716, in which the protruding portion 716 can be made from the color filter or the micro lens. The shape of the protruding portion 716 can be square (as shown in FIG. 8A), circle (as shown in FIG. 8B), polygon (as shown in FIG. 8C), or rhombus (as shown in FIG. 8D).

Reference is made to FIGS. 9, 10, 12, 13, 14, 15, 16, and 17, in which FIGS. 9, 10, 12, 13, 14, 15, 16, and 17 are schematic cross-sectional views of different steps of a method for manufacturing the image sensor, according to some embodiments of the disclosure. As shown on FIG. 9, the method starts at step S11, a color filter material 810 is deposited on the substrate 800 having photodiodes 802 embedded therein. The color filter material 810 is an inorganic material, thus the top surface of the color filter material 810 after depositing is not a flat surface. A planarization process is further performed to flatten the top surface of the color filter material 810. The deposition process and the planarization process can be performed more than once till the color filter material 810 has sufficient thickness with the flat top surface.

Prior to depositing the color filter material 810 on the substrate 800, a layer of a grid material layer such as a barrier structure 822 is formed on the substrate 800. The barrier structure 822 is a grid structure, and the photodiodes 802 are located between the adjacent portions of the barrier structure 822.

Figure 10:
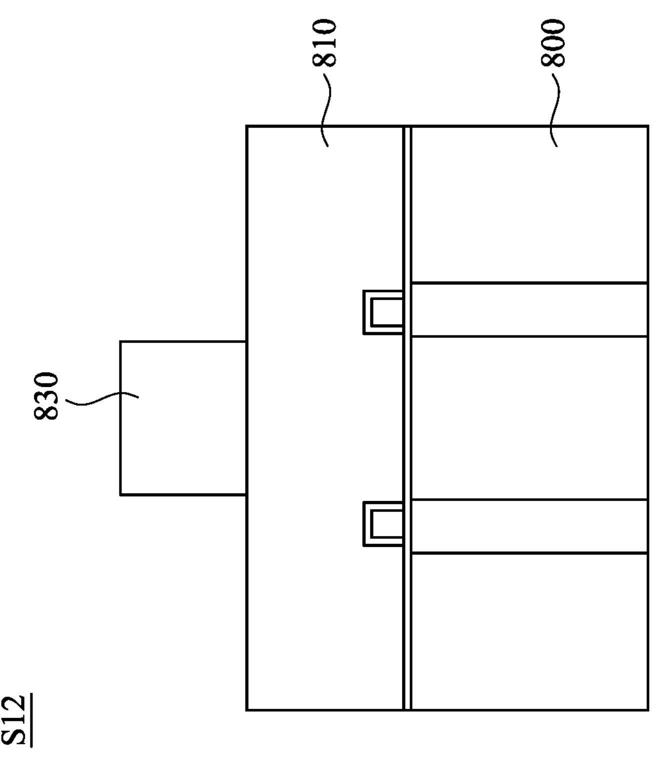
FIGS. 9-23 are schematic cross-sectional views of different steps of methods for manufacturing the image sensor, according to some embodiments of the disclosure.
Figure 9:
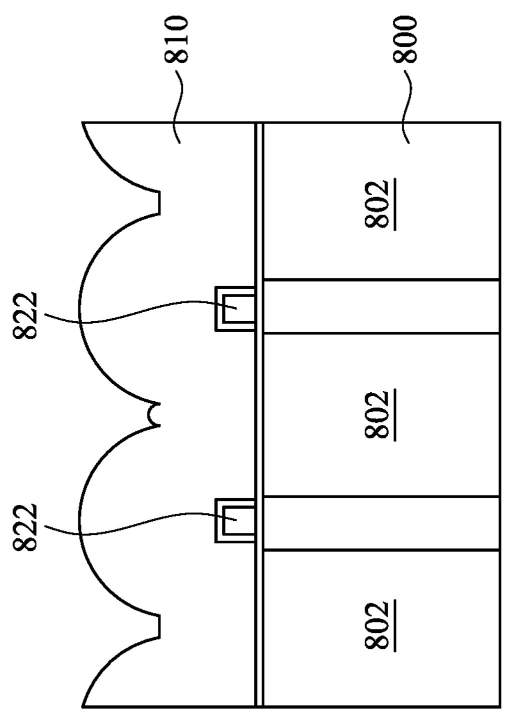

As shown in FIG. 10, the method goes to step S12. The color filter material 810 has sufficient thickness with the flat top surface. A mask 830 is formed on the predetermined position of the color filter material 810.

Figure 12:
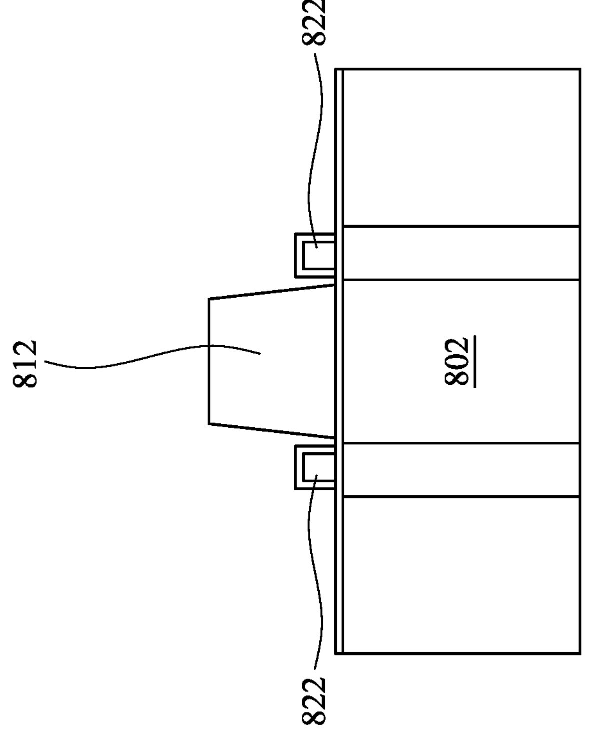

As shown in FIG. 10 and FIG. 12, the method goes to step S13. An etching process is performed to remove the portions of the color filter material 810 uncovered by the mask 830. The mask 830 protects the underlying portion of the color filter material 810, thus the portion of the color filter material 810 protected by the mask 830 is remained after the etching process and becomes the color filter 812. In some embodiments, the mask 830 is removed after the color filter 812. In some other embodiments, the mask 830 is consumed during the etching process.

The color filter 812 is disposed above one of the photodiodes 802 and is between the adjacent portions of the barrier structure 822. In some embodiments, the etching process is performed such that the color filter 812 has a taper cross section with a narrower top surface and a wider bottom surface.

Figure 13:
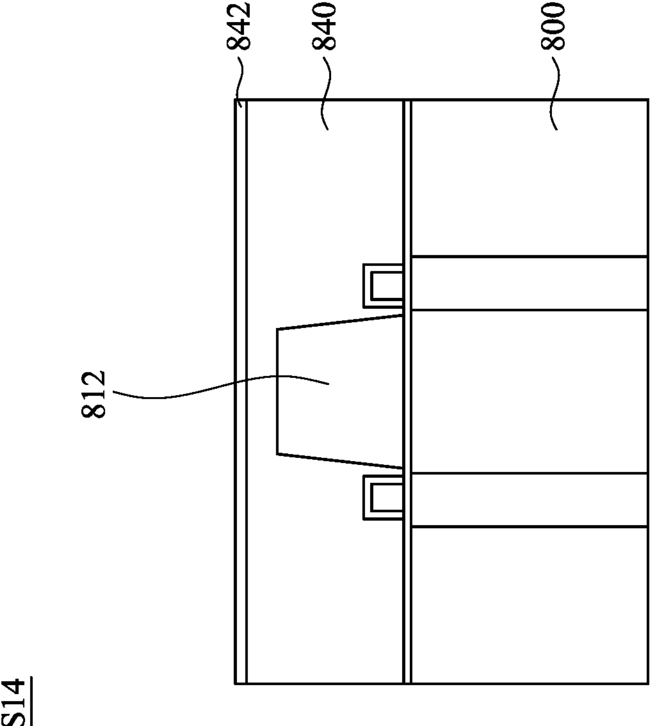

As shown in FIG. 13, the method goes to step S14. A layer of a grid material layer such as a spacing material 840 is formed on the substrate 800. The spacing material 840 also covers the top surface of the color filter 812. An oxide liner 842 is then formed on the top surface of the spacing material 840.

Figure 14:
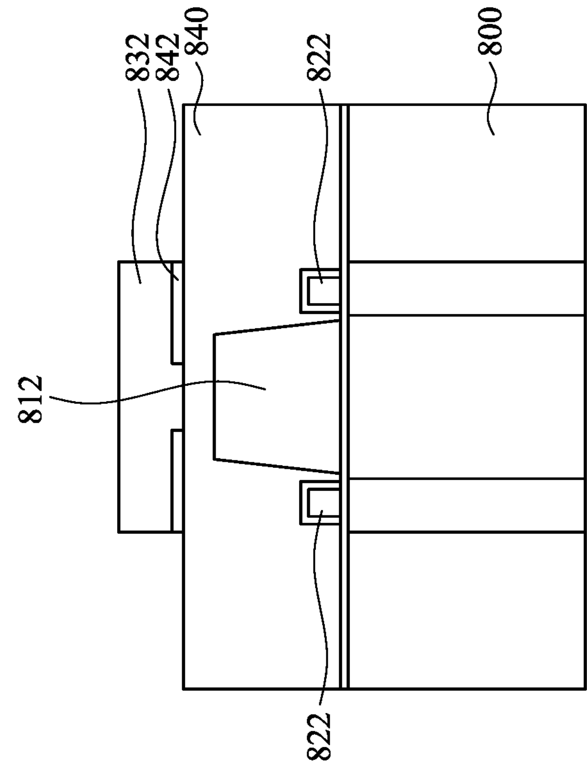

As shown in FIG. 14, the method goes to step S15. The oxide liner 842 is patterned such that the portions of the oxide liner 842 are removed. The remaining portion of the oxide liner 842 is directly over the barrier structure 822, the peripheral portion of the color filter 812 is covered by the oxide liner 842, and the center portion of the color filter 812 is not covered by the oxide liner 842. A hard mask 832 is formed on the spacing material 840. The hard mask 832 covers the color filter 812, the barrier structure 822, and the remaining portion of the oxide liner 842.

Figure 15:
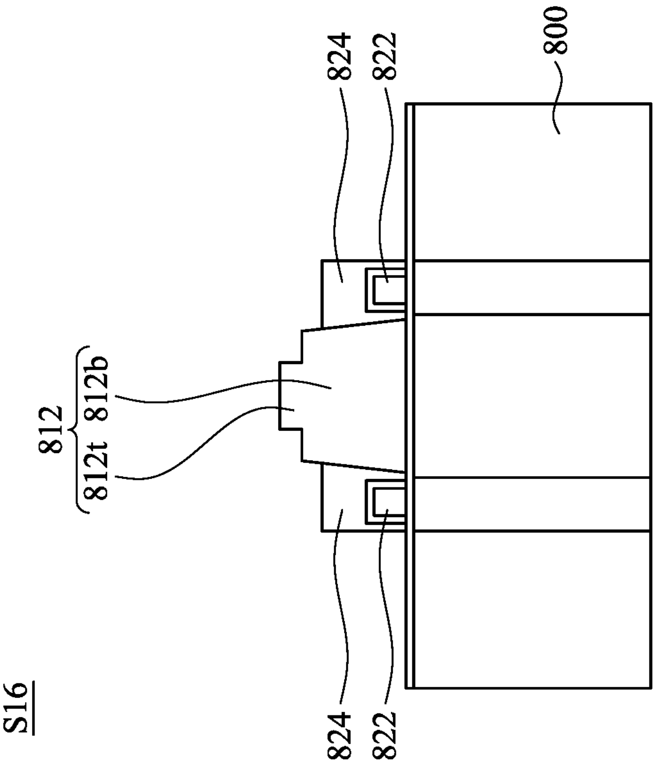

As shown in FIG. 15, the method goes to step S16. A dry etching process is performed such that portion of the spacing material 840 not protected by the hard mask 832 and/or the oxide liner 842 (as shown in FIG. 14) is removed, and the color filter 812 is patterned.

The color filter 812 is patterned after the dry etching process such that the color filter 812 has a bottom portion 812*b* and a top portion 812*t* on the bottom portion 812*b*. The width of the top portion 812*t* is less than the width of the bottom portion 812*b*. The portion of the spacing material 840 is also etched during the dry etching process to form a spacing layer 824 on the barrier structure 822. The height of the spacing layer 824 is less than the height of the color filter 812. More particularly, the top surface of the spacing layer 824 is below the top surface of the top portion 812*t* of the color filter 812.

Figure 16:
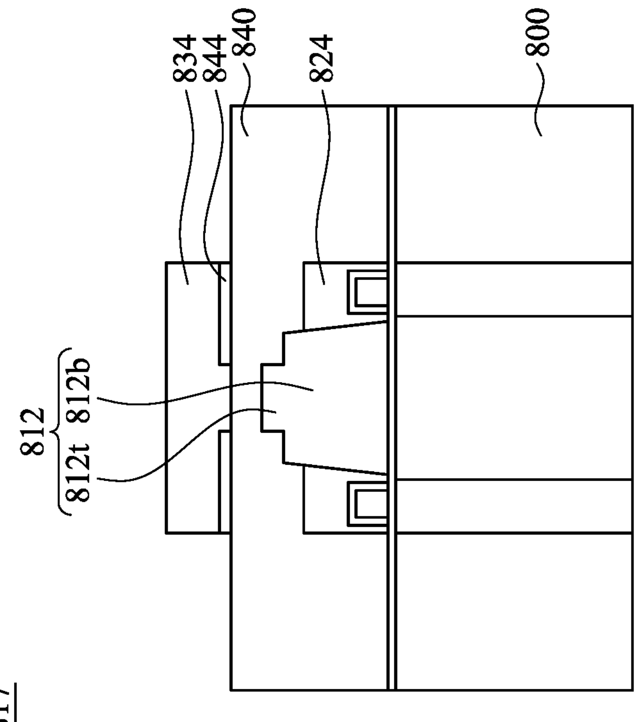

As shown in FIG. 16, the method goes to step S17. A layer of a grid material layer such as a transparent material 850 is deposited on the structure of FIG. 15, and the transparent material 850 is over the color filter 812, the spacing layer 824, and the substrate 800. A patterned oxide liner 844 and a hard mask 834 are formed on the transparent material 850 such that the top portion 812*t* of the color filter 812 is protected by the hard mask 834, and the spacing layer 824 and a peripheral of the bottom portion 812*b* of the color filter 812 are protected by the hard mask 834 and the patterned oxide liner 844.

Figure 17:
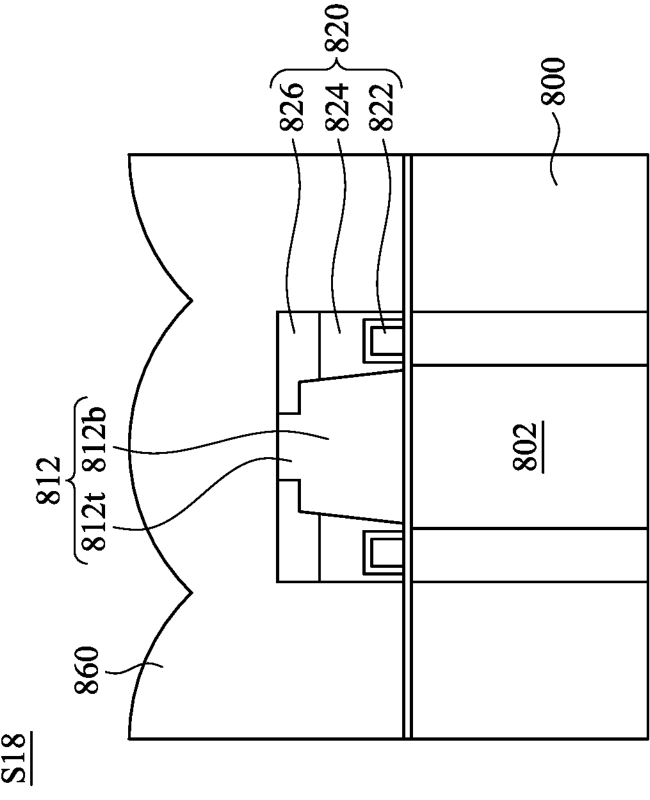

As shown in FIG. 17, the method goes to step S18. A dry etching process is performed such that portions of the transparent material 850 (as shown in FIG. 16) not protected by the hard mask 832 and/or the patterned oxide liner 842 (as shown in FIG. 16) are removed, thereby forming the shielding portion 826 of the grid 820.

Namely, the grid 820 includes the barrier structure 822, the spacing layer 824 on the barrier structure 822, and the shielding portion 826 on the spacing layer 824. The shielding portion 826 surrounding the top portion 812*t* of the color filter 812, and the top surface of the shielding portion 826 is substantially level with the top surface of the top portion 812*t* of the color filter 812. The top portion 812*t* of the color filter 812 can be used as the protruding portion filling in the cavity over the photodiode 802. Then a micro lens layer 860 is formed on the substrate 800.

Figure 18:
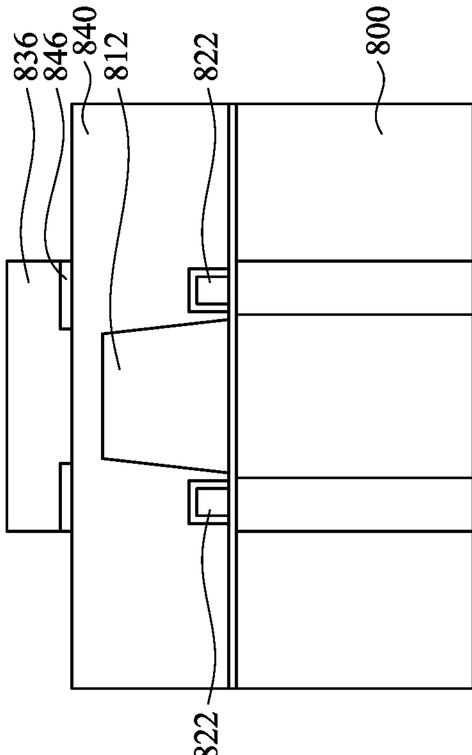

Reference is made to FIGS. 18, 19, 20, and 21, in which FIGS. 18, 19, 20, and 21 are schematic cross-sectional views of different steps of a method for manufacturing the image sensor, according to some other embodiments of the disclosure. As shown in FIG. 18, following after FIG. 12, the method goes to step S21. A spacing material 840 is deposited on the substrate 800 and on the barrier structure 822 and the color filter 812. A patterned oxide liner 846 and a hard mask 836 are formed on the spacing material 840. The patterned oxide liner 846 covers the barrier structure 822, and the color filter 812 is substantially not covered by the patterned oxide liner 846. The hard mask 836 covers the barrier structure 822 and the color filter 812.

Figure 19:
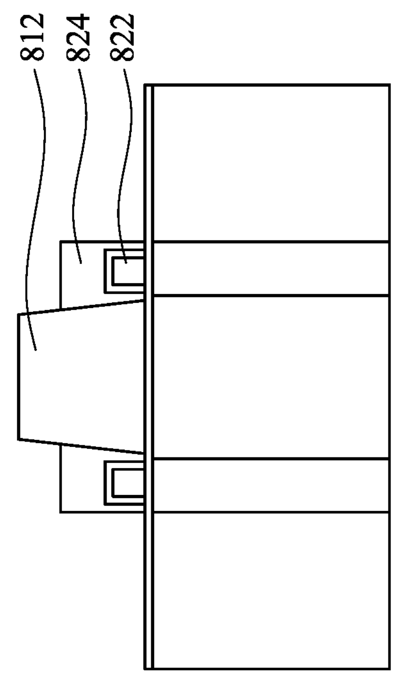

As shown in FIG. 19, the method goes to step S22. A dry etching process is performed such that the portions of the spacing material 840 (as shown in FIG. 18) uncovered by the patterned oxide liner 846 and/or the hard mask 836 (as shown in FIG. 18) are removed, and the remaining portion of the spacing material 840 becomes the spacing layer 824 on the barrier structure 822. The height of the spacing layer 824 is less than the height of the color filter 812. The color filter 812 has a substantially flat top surface.

Figure 20:
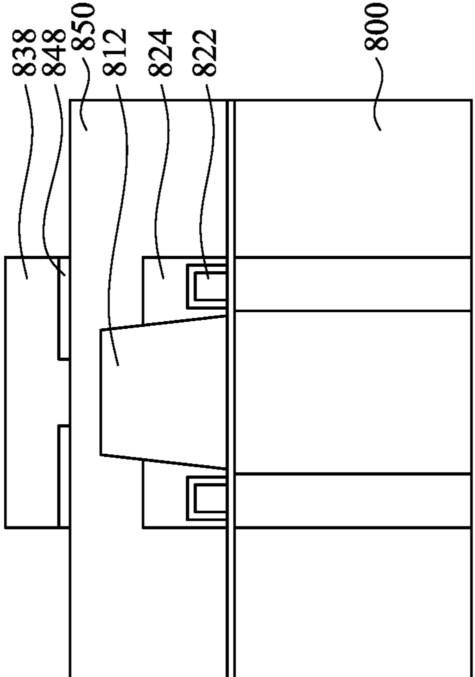

As shown in FIG. 20, the method goes to step S23. A transparent material 850 is deposited on the substrate 800. A patterned oxide liner 848 and a hard mask 838 are formed on the transparent material 850. The patterned oxide liner 848 covers the spacing layer 824 and a peripheral portion of the color filter 812, and a center portion of the color filter 812 is not covered by the patterned oxide liner 848. The hard mask 838 is formed covering the patterned oxide liner 848 and the color filter 812.

Figure 21:
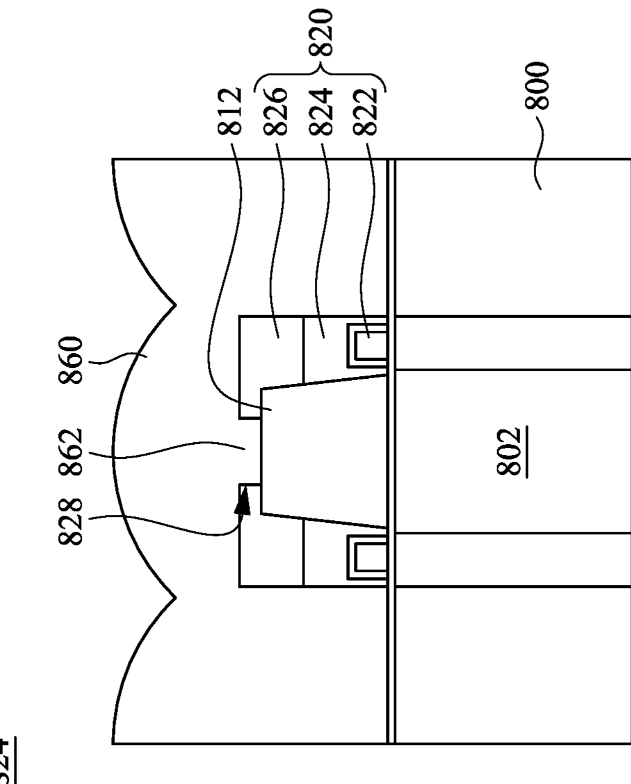

As shown in FIG. 21, the method goes to step S24. A dry etching process is performed such that portions of the transparent material 850 (as shown in FIG. 20) not protected by the hard mask 838 and/or the patterned oxide liner 848 (as shown in FIG. 20) are removed, thereby forming the shielding portion 826 of the grid 820.

Namely, the grid 820 includes the barrier structure 822, the spacing layer 824 on the barrier structure 822, and the shielding portion 826 on the spacing layer 824. The shielding portion 826 covers the peripheral of the color filter 812 thereby defining a cavity 828 on the color filter 812. The top surface of the shielding portion 826 is higher than the top surface of the color filter 812. Then a micro lens layer 860 is formed on the substrate 800, in which a portion 862 of the micro lens layer 860 is filled in the cavity 828 as the protruding portion over the photodiode 802.

Figure 23:
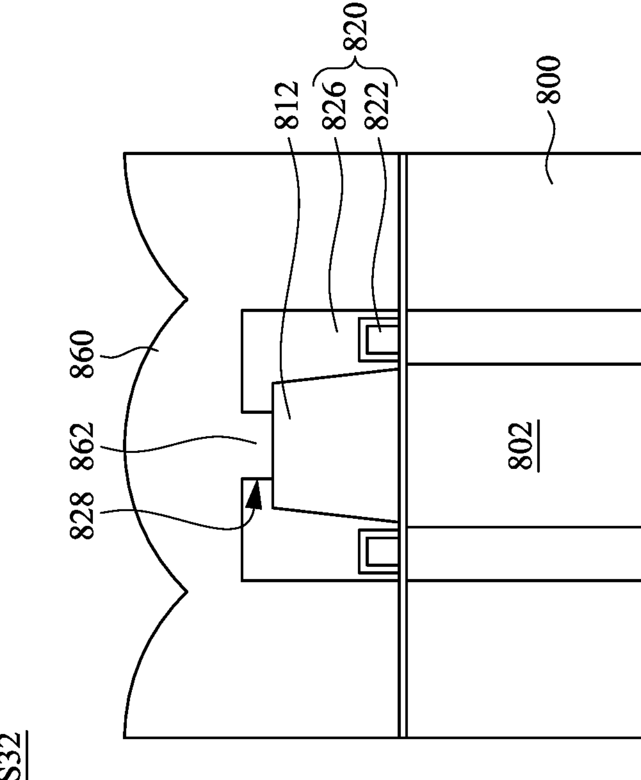
Figure 22:
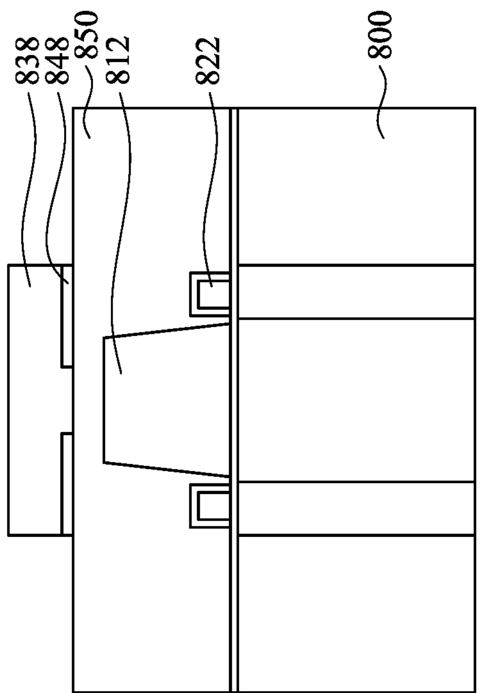

Reference is made to FIGS. 22 and 23, in which FIGS. 22 and 23 are schematic cross-sectional views of different steps of a method for manufacturing the image sensor, according to some other embodiments of the disclosure. As shown in FIG. 22, following after FIG. 12, the method goes to step S31. A transparent material 850 is directly deposited on the substrate 800, without the spacing material therebetween. A patterned oxide liner 848 and a hard mask 838 are formed on the transparent material 850. The patterned oxide liner 848 covers the barrier structure 822 and a peripheral portion of the color filter 812, and a center portion of the color filter 812 is not covered by the patterned oxide liner 848. The hard mask 838 is formed covering the patterned oxide liner 848 and the color filter 812.

As shown in FIG. 23, the method goes to step S32. A dry etching process is performed such that portions of the transparent material 850 (as shown in FIG. 22) not protected by the hard mask 838 and/or the patterned oxide liner 848 (as shown in FIG. 22) are removed, thereby forming the shielding portion 826 of the grid 820.

Namely, the grid 820 includes the barrier structure 822 and the shielding portion 826 on the barrier structure 822. The shielding portion 826 covers the peripheral of the color filter 812 thereby defining a cavity 828 on the color filter 812. The top surface of the shielding portion 826 is higher than the top surface of the color filter 812. Then a micro lens layer 860 is formed on the substrate 800, in which a portion 862 of the micro lens layer 860 is filled in the cavity 828 as the protruding portion over the photodiode 802.

Figure 11:
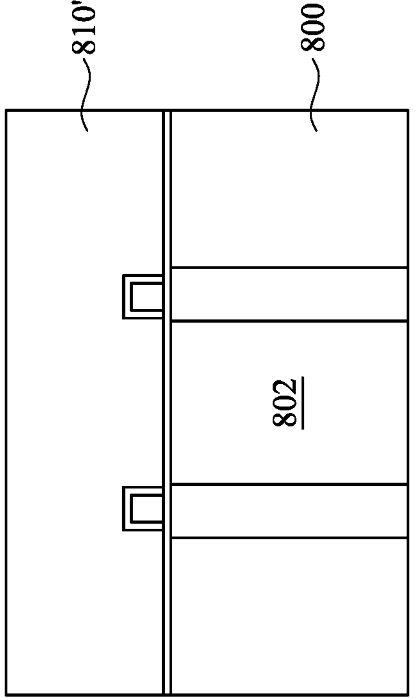

Reference is made back to FIG. 11 and FIG. 12. FIG. 11 and FIG. 12 are schematic cross-sectional views of different steps of a method for manufacturing the image sensor, according to some other embodiments of the disclosure. As shown on FIG. 11, the method starts at step S11', a color filter material 810' is deposited on the substrate 800 having photodiodes 802 embedded therein. The color filter material 810' is an organic material, thus the top surface of the color filter material 810' after depositing is a flat surface.

The color filter material 810' is then exposed and developed to remove portions of the color filter material 810'. The remaining portion of the color filter material 810' becomes the color filter 812 as shown in FIG. 12. The color filter 812 is disposed above one of the photodiodes 802 and is between the adjacent portions of the barrier structure 822. The following steps of the fabrication method are continued as discussed in FIG. 13 to FIG. 17, FIG. 18 to FIG. 21, or FIG. 22 to FIG. 23.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims and their equivalents.

What is claimed is:

1. An image sensor, comprising:

a first color filter disposed on a first photodiode;

a first grid comprising a first main portion and a first shielding portion extended from the first main portion, the first main portion surrounding the first color filter and the first shielding portion partially covering the first color filter such that a first cavity defined by the first shielding portion is configured over the first color filter;

a first micro lens disposed on the first color filter and the first grid, wherein the first color filter or the first micro lens comprises a first protruding portion filled in the first cavity, and a width of the first protruding portion is in a range from 0.1 pixel size to 0.8 pixel size;

a second color filter disposed on a second photodiode;

a second grid comprising a second main portion and a second shielding portion extended from the second main portion, the second main portion surrounding the second color filter and the second shielding portion partially covering the second color filter such that a second cavity defined by the second shielding portion is configured over the second color filter; and a second micro lens disposed on the second color filter and the second grid, wherein the second color filter or the second micro lens comprises a second protruding portion filled in the second cavity, a width of the second protruding portion is different from the width of the first protruding portion, and the width of the second protruding portion is in a range from 0.1 pixel size to 0.8 pixel size, wherein the pixel size is a distance between centers of a pair of deep trench isolation portions at opposite sides of the corresponding photodiode, and wherein a thickness of the first protruding portion is less than a height of the first main portion of the first grid, and a thickness of the second protruding portion is less than a height of the second main portion of the second grid.

2. The image sensor of claim 1, wherein a top surface of the first protruding portion of the first color filter is coplanar with a top surface of the first shielding portion of the first grid.

3. The image sensor of claim 1, wherein a bottom surface of the first protruding portion of the first micro lens is coplanar with a bottom surface of the first shielding portion of the first grid.

4. The image sensor of claim 1, wherein a shape of the second protruding portion is different from a shape of the first protruding portion, and the shape of the first protruding portion and the shape of the second protruding portion comprise square, circle, polygon and rhombus.

5. The image sensor of claim 1, wherein the first photodiode has a first center line, the second photodiode has a second center line, the first protruding portion has a third center line, the second protruding portion has a fourth center line, and a first distance between the first center line and the third center line is different from a second distance between the second center line and the fourth center line.

6. The image sensor of claim 5, wherein a ratio of the first distance to the pixel size is in a range from about 0.1 to about 0.5.

7. The image sensor of claim 5, wherein a ratio of the first distance to the second distance is in a range from about 0.1 to about 0.9.

8. The image sensor of claim 5, wherein the first micro lens has a fifth center line, and the first distance is less than a third distance between the first center line and the fifth center line.

9. The image sensor of claim 8, wherein the second micro lens has a sixth center line, and the third distance is different from a fourth distance between the second center line and the sixth center line.

10. The image sensor of claim 9, wherein a ratio of the third distance to the fourth distance is in a range from about 0.1 to about 0.9.

11. An image sensor, comprising:

a first color filter disposed on a first photodiode;

a first grid comprising a first main portion and a first shielding portion extended from the first main portion, the first main portion surrounding the first color filter and the first shielding portion partially covering the first color filter such that a first cavity defined by the first shielding portion is configured over the first color filter;

a first micro lens disposed on the first color filter and the first grid, wherein the first color filter or the first micro lens comprises a first protruding portion filled in the first cavity, and a width of the first protruding portion is in a range from 0.1 pixel size to 0.8 pixel size;

a second color filter disposed on a second photodiode;

a second grid comprising a second main portion and a second shielding portion extended from the second main portion, the second main portion surrounding the second color filter and the second shielding portion partially covering the second color filter such that a second cavity defined by the second shielding portion is configured over the second color filter; and a second micro lens disposed on the second color filter and the second grid, wherein the second color filter or the second micro lens comprises a second protruding portion filled in the second cavity, a width of the second protruding portion is different from the width of the first protruding portion, and the width of the second protruding portion is in a range from 0.1 pixel size to 0.8 pixel size, wherein the pixel size is a distance between centers of a pair of deep trench isolation portions at opposite sides of the corresponding photodiode, and wherein a thickness of the second protruding portion is different from a thickness of the first protruding portion.

12. The image sensor of claim 11, wherein a thickness of the first protruding portion is less than a height of the first main portion of the first grid, and a thickness of the second protruding portion is less than a height of the second main portion of the second grid.

13. A manufacturing method of an image sensor, comprising:

forming a first color filter over a first photodiode and a second color filter over a second photodiode;

forming a grid material layer over the first color filter and the second color filter;

etching the grid material layer to form a first grid and a second grid, wherein the first grid comprises a first main portion and a first shielding portion extended from the first main portion, the first main portion surrounds the first color filter and the first shielding portion covers an edge of the first color filter, the second grid comprises a second main portion and a second shielding portion extended from the second main portion, the second main portion surrounds the second color filter and the second shielding portion covers an edge of the second color filter; and forming a first micro lens over the first color filter and the first grid and a second micro lens over the second color filter and the second grid, wherein the first color filter or the first micro lens comprises a first protruding portion surrounded by the first shielding portion, and the second color filter or the second micro lens comprises a second protruding portion surrounded by the second shielding portion wherein a width of the second protruding portion is different from the width of the first protruding portion, and wherein a thickness of the first protruding portion is less than a height of the first main portion of the first grid, and a thickness of the second protruding portion is less than a height of the second main portion of the second grid.

14. The method of claim 13, wherein a width of the first protruding portion of the first color filter is in a range from 0.1 pixel size to 0.8 pixel size, and the pixel size is a distance between centers of a pair of deep trench isolation portions at opposite sides of the first photodiode.

15. The method of claim 13, wherein etching the grid material layer to form the first grid comprises forming a cavity defined by the first shielding portion, and forming the first micro lens over the first color filter and the first grid is performed such that the first micro lens comprises a protruding portion filled in the cavity, and a width of the protruding portion of the first micro lens is in a range from 0.1 pixel size to 0.8 pixel size, wherein the pixel size is a distance between centers of a pair of deep trench isolation portions at opposite sides of the first photodiode.

16. The method of claim 13, wherein forming the grid material layer over the first color filter comprises:

forming a barrier structure on a substrate comprising the first photodiode;

forming a transparent material over the first color filter and the barrier structure; and etching the transparent material to form the first shielding portion.

17. The method of claim 13, wherein forming the grid material layer over the first color filter comprises:

forming a barrier structure on a substrate comprising the first photodiode;

forming a spacing material over the first color filter and the barrier structure;

etching the spacing material to form a spacing layer, wherein a height of the spacing layer is less than a height of the first color filter;

forming a transparent material over the first color filter and the spacing layer; and etching the transparent material to form the first shielding portion.

18. The method of claim 13, wherein the first color filter is made of an inorganic material, and forming the first color filter over the first photodiode comprises:

depositing a color filter material over the first photodiode;

planarizing the color filter material; and etching the color filter material.

19. The method of claim 13, wherein the first color filter is made of an organic material, and forming the first color filter over the first photodiode comprises:

depositing a color filter material over the first photodiode;

exposing the color filter material; and developing the color filter material.

* * * * *